__US009106124B2__

(12) United States Patent
Bayerer et al.

(10) Patent No.: US 9,106,124 B2
(45) Date of Patent: Aug. 11, 2015

(54) LOW-INDUCTANCE POWER SEMICONDUCTOR ASSEMBLY

(75) Inventors: Reinhold Bayerer, Warstein (DE); Daniel Domes, Ruethen (DE)

(73) Assignee: Infineon Technologies AG, Neubiberg (DE)

( * ) Notice: Subject to any disclaimer, the term of this patent is extended or adjusted under 35 U.S.C. 154(b) by 713 days.

(21) Appl. No.: 13/040,348

(22) Filed: Mar. 4, 2011

(65) Prior Publication Data

US 2011/0216561 A1 Sep. 8, 2011

(30) Foreign Application Priority Data

Mar. 5, 2010 (DE) .......................... 10 2010 002 627

(51) Int. Cl.
*H05K 7/02* (2006.01)
*H02M 7/00* (2006.01)
*H01L 25/16* (2006.01)

(52) U.S. Cl.
CPC .............. *H02M 7/003* (2013.01); *H01L 25/162* (2013.01); *H01L 2224/48091* (2013.01); *H01L 2224/73265* (2013.01); *H01L 2924/1305* (2013.01); *H01L 2924/13055* (2013.01); *H01L 2924/13062* (2013.01); *H01L 2924/13091* (2013.01); *H01L 2924/30107* (2013.01)

(58) Field of Classification Search
USPC .......... 361/807; 257/334, 700, 703, 719, 758, 257/776; 363/37, 125; 307/89; 327/419, 327/427
See application file for complete search history.

(56) References Cited

U.S. PATENT DOCUMENTS

| | | | | |
|---|---|---|---|---|
| 4,490,626 A | * | 12/1984 | Carlson | 327/408 |
| 4,514,649 A | * | 4/1985 | Nuzillat et al. | 326/116 |
| 5,038,267 A | * | 8/1991 | De Doncker et al. | 363/89 |
| 5,150,287 A | * | 9/1992 | Gruning | 363/135 |
| 5,261,747 A | * | 11/1993 | Deacutis et al. | 374/137 |
| 5,574,312 A | * | 11/1996 | Bayerer et al. | 257/706 |
| 7,466,185 B2 | * | 12/2008 | Bayerer | 327/389 |
| 7,548,825 B2 | * | 6/2009 | Bayerer et al. | 702/99 |
| 7,561,446 B1 | * | 7/2009 | Vinciarelli | 363/17 |
| 7,768,337 B2 | * | 8/2010 | Bayerer | 327/389 |
| 7,791,208 B2 | * | 9/2010 | Bayerer | 257/776 |
| 7,808,100 B2 | * | 10/2010 | Bayerer | 257/719 |
| 8,018,047 B2 | * | 9/2011 | Bayerer et al. | 257/700 |
| 8,120,391 B2 | * | 2/2012 | Bayerer et al. | 327/108 |
| 8,146,513 B2 | * | 4/2012 | Ibaiondo Madariaga et al. | 104/289 |
| 8,154,114 B2 | * | 4/2012 | Bayerer | 257/700 |
| 8,212,413 B2 | * | 7/2012 | Jansen et al. | 307/89 |
| 8,228,113 B2 | * | 7/2012 | Domes | 327/427 |
| 8,441,128 B2 | * | 5/2013 | Domes | 257/758 |
| 8,649,198 B2 | * | 2/2014 | Kuzumaki et al. | 363/132 |
| 2005/0007047 A1 | * | 1/2005 | Strothmann et al. | 318/268 |
| 2006/0197491 A1 | * | 9/2006 | Nojima | 318/801 |

(Continued)

FOREIGN PATENT DOCUMENTS

DE 102007024413 A1 12/2007
DE 102007058556 A1 6/2008

OTHER PUBLICATIONS

Office Action issued Dec. 6, 2010 in re Application No. DE102010002627.1-33.

*Primary Examiner* — Xiaoliang Chen
(74) *Attorney, Agent, or Firm* — Murphy, Bilak & Homiller, PLLC

(57) ABSTRACT

A low-inductive power semiconductor assembly is provided in which semiconductor switches are arranged behind one another in a main current path.

8 Claims, 17 Drawing Sheets

(56) References Cited

U.S. PATENT DOCUMENTS

| | | | |
|---|---|---|---|
| 2007/0158859 A1* | 7/2007 | Hierholzer | 257/784 |
| 2007/0176626 A1* | 8/2007 | Bayerer et al. | 324/771 |
| 2007/0290311 A1 | 12/2007 | Hauenstein | |
| 2008/0106319 A1* | 5/2008 | Bayerer | 327/432 |
| 2008/0135932 A1* | 6/2008 | Ozeki et al. | 257/334 |
| 2009/0016088 A1* | 1/2009 | Bayerer et al. | 363/125 |
| 2009/0039498 A1* | 2/2009 | Bayerer | 257/700 |
| 2009/0085219 A1* | 4/2009 | Bayerer | 257/776 |
| 2009/0153223 A1* | 6/2009 | Bayerer | 327/389 |
| 2009/0261472 A1* | 10/2009 | Bayerer | 257/719 |
| 2010/0065962 A1* | 3/2010 | Bayerer et al. | 257/703 |
| 2010/0066175 A1* | 3/2010 | Jansen et al. | 307/89 |
| 2010/0085105 A1* | 4/2010 | Bayerer et al. | 327/419 |
| 2010/0164601 A1* | 7/2010 | Jansen | 327/482 |
| 2010/0254163 A1* | 10/2010 | Martini et al. | 363/17 |
| 2011/0019453 A1* | 1/2011 | Gonzalez Senosiain et al. | 363/131 |
| 2011/0075451 A1* | 3/2011 | Bayerer et al. | 363/37 |
| 2011/0102054 A1* | 5/2011 | Domes | 327/419 |
| 2012/0112775 A1* | 5/2012 | Domes | 324/686 |
| 2012/0206948 A1* | 8/2012 | Maldini et al. | 363/97 |
| 2012/0281442 A1* | 11/2012 | Revelant et al. | 363/40 |
| 2013/0043593 A1* | 2/2013 | Domes | 257/758 |
| 2013/0200859 A1* | 8/2013 | Jiang-Hafner et al. | 320/166 |

\* cited by examiner

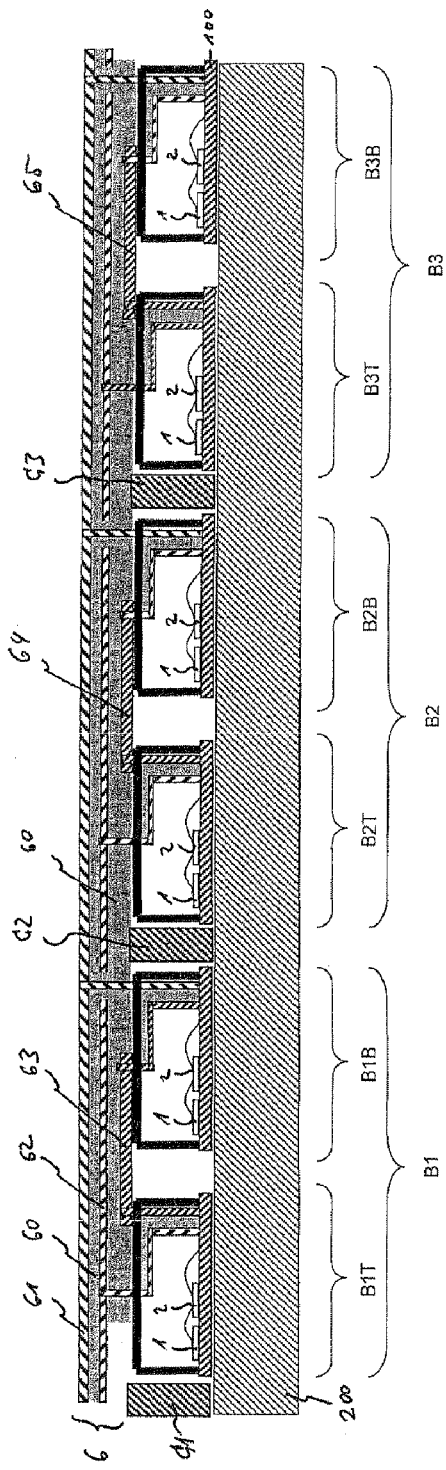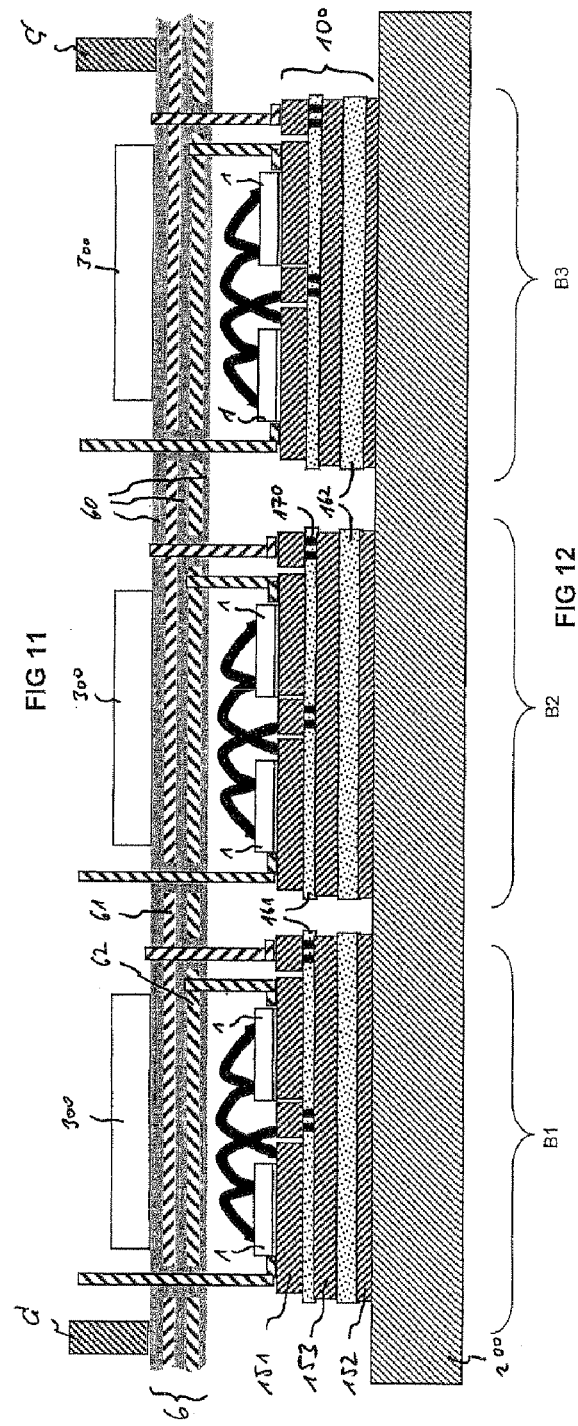
FIG 11
FIG 12

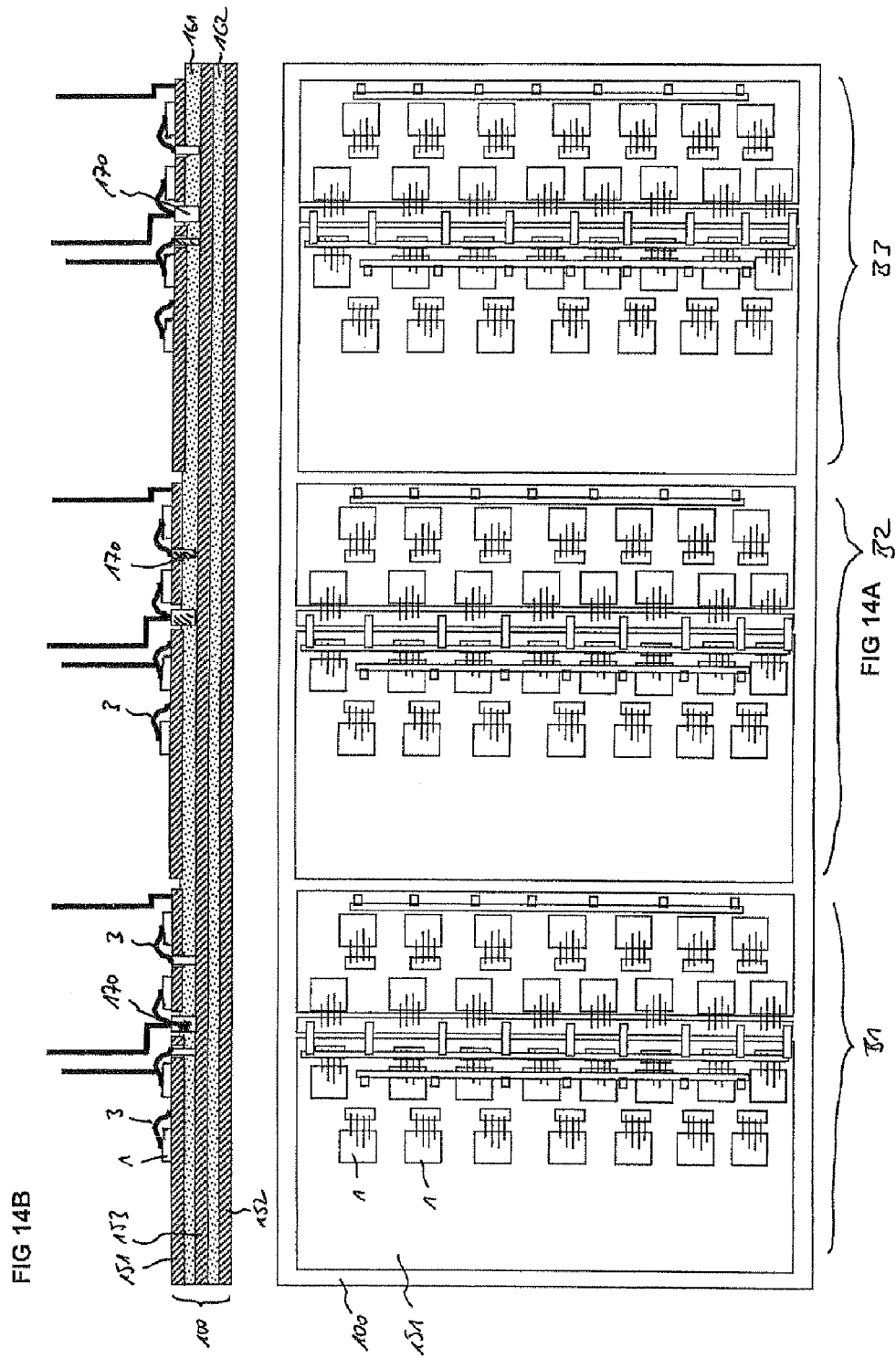

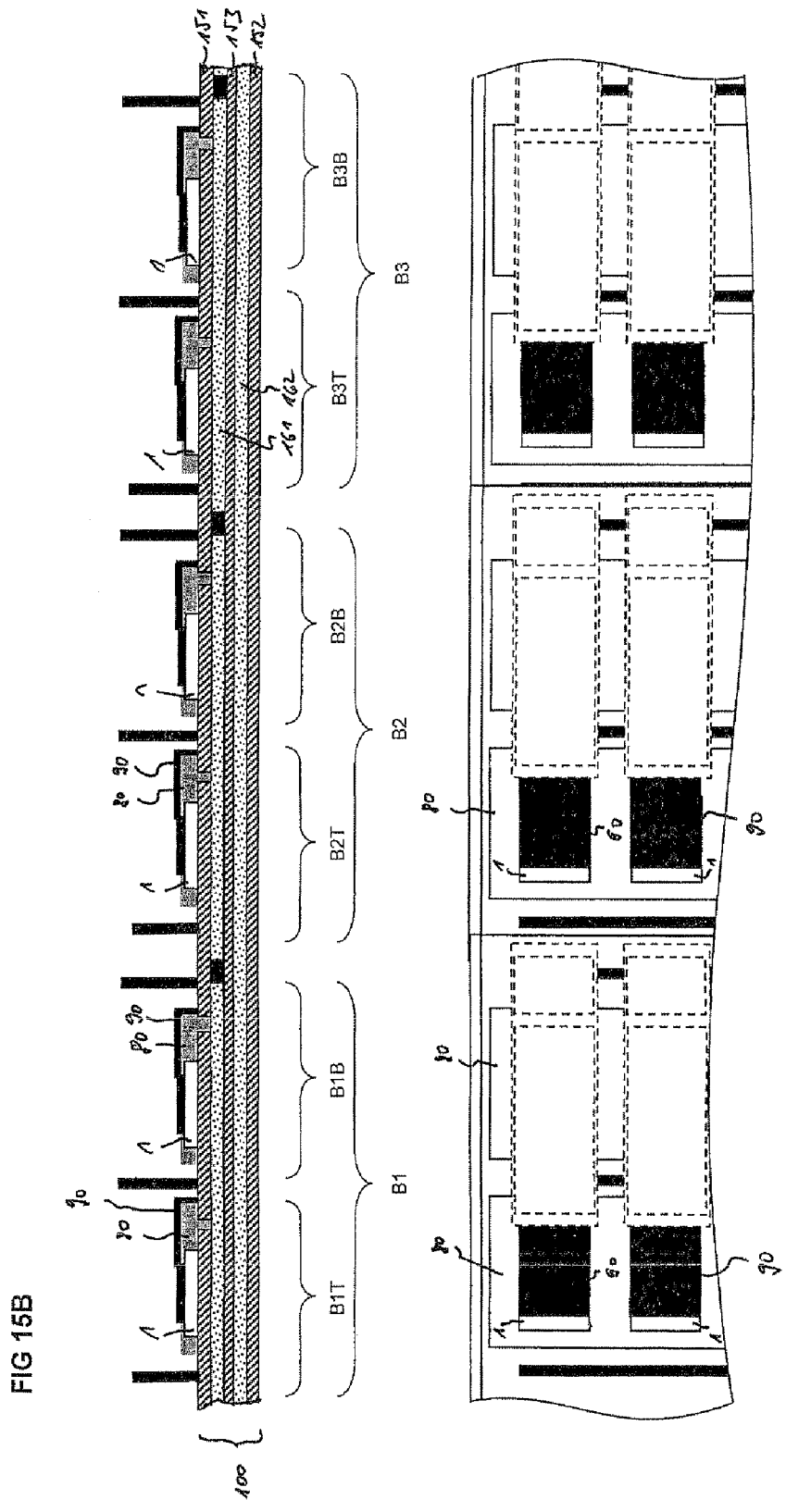

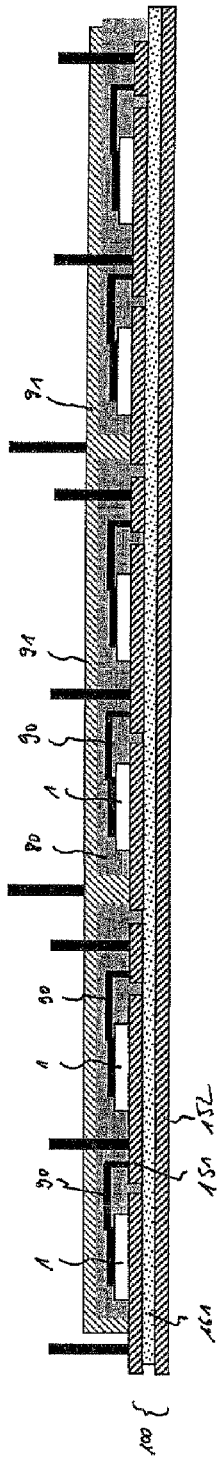
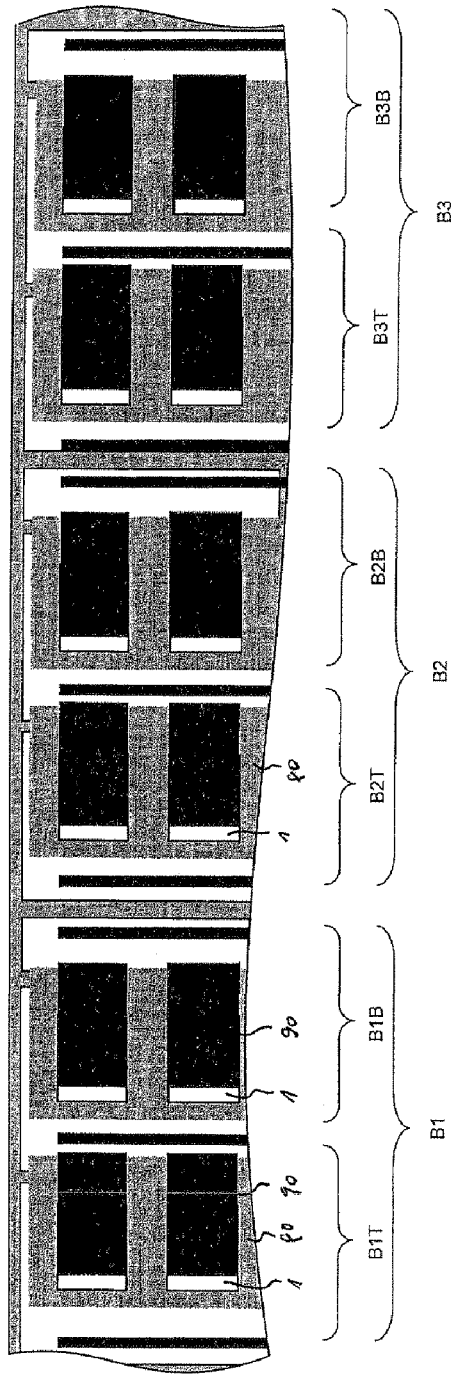
FIG 16B
FIG 16A

LOW-INDUCTANCE POWER SEMICONDUCTOR ASSEMBLY

PRIORITY CLAIM

This application claims priority to German Patent Application No. 10 2010 002 627.1 filed on 5 Mar. 2010, the content of said application incorporated herein by reference in its entirety.

TECHNICAL FIELD

The present application relates to power semiconductor assemblies, particularly power semiconductor assemblies including two or more bridge branches each having a phase output for operating an external load.

BACKGROUND

FIG. 1 shows a conventional converter having three half-bridge branches B1, B2 and B3 which have in each case an upper bridge branch B1T, B2T, and B3T, respectively, a lower bridge branch B1B, B2B and B3B, respectively, and a phase output PH1, PH2 and PH3, respectively. The phase outputs PH1, PH2 and PH3 are connected to a common load M, for example a motor. With respect to the individual bridge branches B1, B2 and B3, the load M has in each case a load inductance L1, L2 and L3, respectively. Since the inductances involved are in the foreground for the following considerations, the representation of ohmic components of the load M and of the other components was omitted, but they are still unavoidably present.

Each of the three half bridges B1, B2 and B3 includes two controllable semiconductor switches Z1/Z2, Z3/Z4 and Z5/Z6, respectively, the load current paths of which are connected in series. A node common to the load current paths forms the phase output PH1, PH2, PH3. In the embodiment shown, the load inductances are interconnected in the shape of a star, i.e. each of the inductances L1-L3 is connected with one terminal to a common star point. As an alternative, the load inductances can also be interconnected triangularly. In this case, each inductance L1-L3 is connected between two of the phase outputs. A freewheeling diode D1, D2, D3, D4, D5 and D6, respectively, is connected in each case antiparallel to each of the semiconductor switches Z1, Z2, Z3, Z4, Z5 and Z6, respectively. To implement the converter, the half-bridges B1, B2 and B3 are in each case connected to a link circuit voltage V1. In addition, a link circuit capacitor C1, C2 and C3 is connected in parallel with each of the half-bridges B1, B2, B3.

To electrically interconnect the individual components within the individual bridge branches B1, B2, B3, conductor tracks, terminal plates and the like must be used, as a result of which stray inductances are unavoidably formed. Some of these stray inductances L4 to L9 are shown by way of example in FIG. 1. Since, due to these stray inductances L4 to L9, high induction voltage peaks occur within the individual bridge branches during the commutation, which, in particular, load the semiconductor switches Z1, Z2, Z3, Z4, Z5, Z6 and the free wheeling diodes D1, D2, D3, D4, D5, D6 and can thus lead to overvoltages and to oscillation phenomena in the entire system, it is attempted in conventional power semiconductor assemblies to keep the stray inductances L4 to L9 as low as possible within the individual bridge branches B1, B2, B3.

Further improvements can be achieved in that inductances L10, L11, L12, L13, L14, L15 of terminal and connecting lines, which extend essentially perpendicularly away from the assembly plane of the semiconductor switches Z1, Z2, Z3, Z4, Z5 and Z6 in a module containing the semiconductor switches, are kept as short as possible and run in parallel and symmetrically.

Despite these improvements, interfering induction voltage peaks can still occur. In converters for high-current applications, the semiconductor switches Z1-Z6 shown by electric switching symbols in FIG. 1 usually include in each case a number of switching elements connected in parallel and driven jointly. Between the individual parallel-connected switching elements, further parasitic inductances can be present in this arrangement. These further inductances can lead to an asymmetry with respect to the current loading of the individual parallel-connected switching elements.

In known converters, the individual bridge branches are usually arranged in a direction perpendicular to the main current direction of the bridge branches next to one another, which is explained with reference to FIG. 1.

The representation in FIG. 1 is selected in such a manner that it reproduces not only the circuit diagram of the arrangement but also the relative position of the controllable power switches Z1, Z2, Z3, Z4, Z5 and Z6 with respect to one another. Accordingly, each of the bridge branches B1, B2, B3 can be allocated a main current direction I1, I2 and I3, respectively, which is in each case indicated by an arrow and is approximately given by the direction of the connecting line between the two power switches Z1 and Z2, between the two power switches Z3 and Z4 and between the two power switches Z5 and Z6, respectively, of the respective bridge B1, B2 and B3. The individual half bridges B1, B2, B3 are arranged next to one another in a transverse direction Q which extends approximately perpendicular to the main current directions I1, I2, I3.

As a result, a considerable transient current flow in the transverse direction Q and therefore also induction voltage peaks which, in particular, also originate from the stray inductances L16, L17, L18 and L19 formed by the sections of the connecting lines extending in the transverse direction Q, are produced during commutation processes in the half bridges B1, B2, B3 due to the interconnection of the bridges B1, B2, B3 with one another in the connecting lines required for this purpose. In the text which follows, this is explained by way of example with reference to FIG. 2.

FIG. 2 shows the arrangement according to FIG. 1 in a particular operating state in which a current flow exists along a first path P1 represented by arrows and by an increased line thickness. With conducting power switches Z1 and Z4 and with nonconducting power switch Z2, the current flows from the link circuit voltage source V12 through the stray inductances L20, L16, L10 and L4, the power switch Z1, the inductances L1 and L2, the power switch Z4 and the stray inductances L7, L13 and L21 back to the link circuit voltage source V1.

During a subsequent commutation process, the power switch Z1 is placed into a non-conducting state, while the power switch F4 remains conducting. Immediately after switch-off, an induced current, the direction of which corresponds to the direction of the current through these inductances L1 and L2 before the switch-off of Z1, occurs in the inductances L1 and L2 due to the energy mainly stored in the inductances L1 and L2 of the external load M.

Since the power switch Z1 is switched off, the current caused by the load inductances L1, L2 flows along a second path P2, also represented by arrows and an increased line thickness, which is shown in FIG. 3. In this arrangement, the current flows, starting from the inductance L1, through the inductance L2, the switched-on power switch Z4, the stray inductances L7, L13, L18, L11 and L5 via the freewheeling diode D2 back to the inductance L1.

As can be seen by comparing FIGS. 2 and 3, the current through the stray inductances L4, L10, L16, L20 and L21 becomes zero due to the commutation process or at least drops significantly, while a current through the stray inductances L18, L11 and L5 is produced or increases significantly. These current changes in the inductances L4, L5, L10, L11, L16, L18, L20 and L21 occur very rapidly especially during "hard" switch-off of Z1. As such, high unwanted induction voltage peaks U4, U5, U10, U11, U16, U18, U20 and U21 occur which are dropped across the respective inductances L4, L5, L10, L11, L16, L18, L20 and L21. In the case of a similar commutation process, unwanted induction voltage peaks also occur in the other circuit parts in a corresponding manner.

SUMMARY

Embodiments described herein relate to providing a power semiconductor assembly including at least two bridge branches, and a power semiconductor arrangement having at least two bridge branches interconnected with one another, in which the occurrence of unwanted induction voltage peaks during commutation processes is improved.

Although minimizing the inductances L4, L5, L10, L11, L20, L21 is addressed in conventional arrangements, a further optimization can be realized by minimizing the stray inductances L16, L17, L18 and L19, called "transverse inductances" as described in more detail later herein.

Embodiments described herein also relate to a power semiconductor assembly including at least two bridge branches each having at least two power switches directly or indirectly connected to a phase output, wherein each of the power switches has at least two parallel-connected switching elements integrated, in each case, into a semiconductor chip. Each of the power switches is arranged in a power semiconductor module and the individual power semiconductor modules are arranged adjacent to one another in a first direction, whereby the semiconductor chips of a power switch are arranged adjacent to one another in the associated power semiconductor module in a second direction extending perpendicular to the first direction.

Embodiments described herein relate to a power semiconductor assembly including at least one bridge branch having at least three power switches directly or indirectly connected to a phase output, whereby each of the power switches has at least two parallel-connected switching elements integrated, in each case, into in a semiconductor chip, whereby each of the power switches is arranged in a power semiconductor module and the individual power semiconductor modules are arranged adjacent to one another in a first direction, and whereby the semiconductor chips of a power switch are arranged adjacent to one another in the associated power semiconductor module in a second direction extending perpendicular to the first direction.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 11 shows a sectional view of a three-phase converter according to an embodiment in which the upper and lower bridge branches are arranged, in each case, on a separate circuit carrier and electrically interconnected by a common strip conductor.

FIG. 12 shows a sectional view of a three-phase converter according to an embodiment in which each bridge branch is arranged on a separate circuit carrier constructed as a multi-layer circuit carrier.

FIG. 14A shows a plan view of a three-phase converter which has a common multi-layer circuit carrier according to an embodiment.

FIG. 14B shows a sectional view of the three-phase converter of FIG. 14A.

FIG. 15A shows a plan view of a three-phase converter according to an embodiment which has a common multi-layer circuit carrier and for the topside interconnection of which a foil technique is used.

FIG. 15B shows a sectional view of the three-phase converter of FIG. 15A.

FIG. 16A shows a plan view of a three-phase converter according to an embodiment which has a common multi-layer circuit carrier, whereby only the to metallization layer of the common multi-layer circuit carrier is patterned, and whereby a foil technique with more than one conductor layers is used for the topside interconnection of the converter.

FIG. 16B shows a sectional view of the three-phase converter of FIG. 16A.

DETAILED DESCRIPTION

Figure 4:
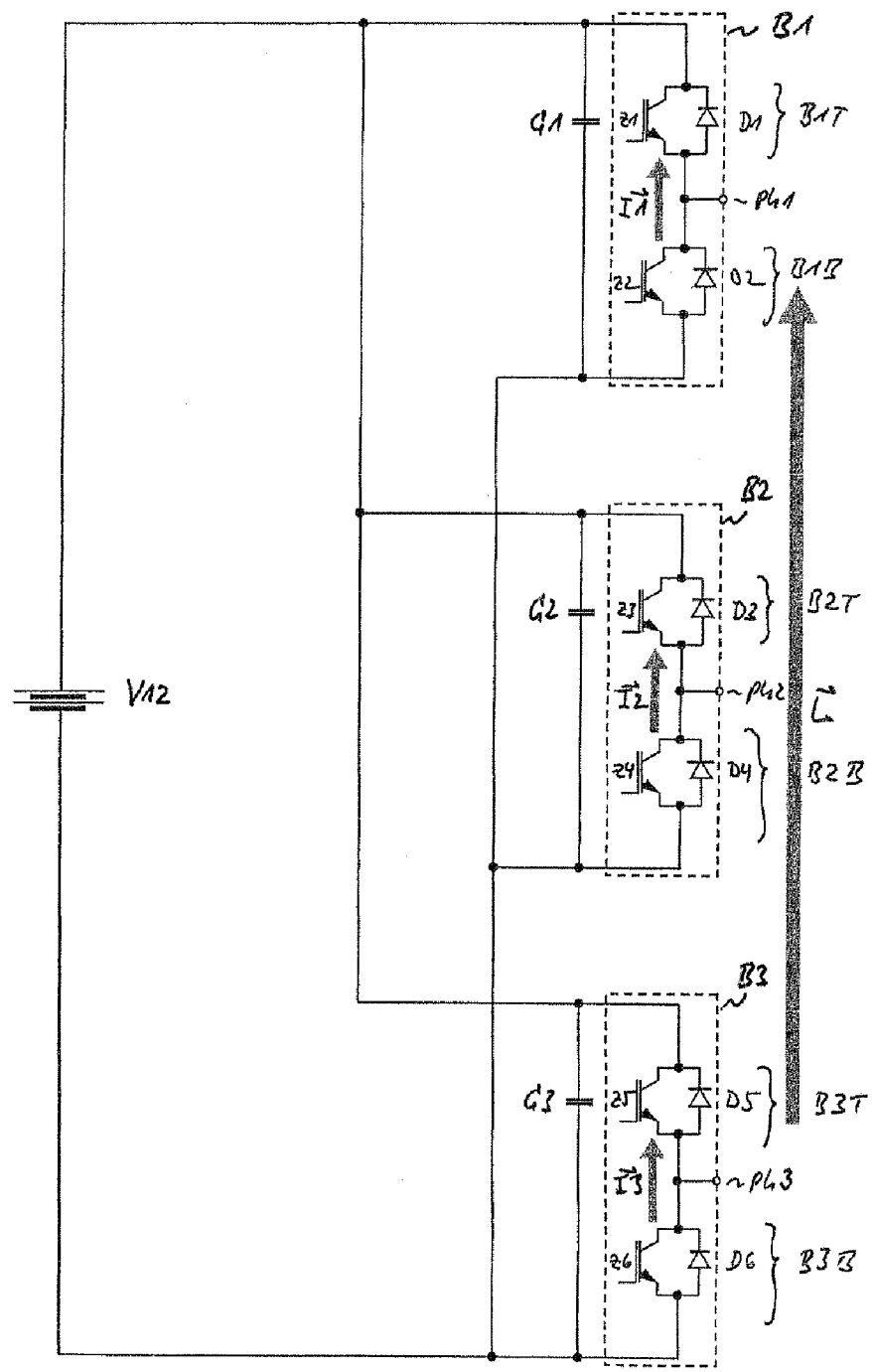
FIG. 4 shows a circuit diagram of a converter according to the present invention, the converter including exemplarily three bridge branches arranged behind one another in respective main current directions according to an embodiment.

FIG. 4 illustrates a first exemplary embodiment of a power semiconductor assembly which is implemented as a three-phase converter. The converter includes three half bridge branches B1, B2, B3 each having two semiconductor switches or power switches Z1, Z2, Z3, Z4, Z5, Z6. Nodes common to load current paths of the semiconductor switches Z1, Z2 of a half bridge B1, B2, B3 in each case form phase outputs Ph1, Ph2, Ph3 of the half bridges, to which a load (not shown), such as e.g. a motor, can be connected.

The semiconductor switches Z1-Z6 of the individual half bridges B1-B3 are represented by electrical switching symbols in FIG. 4. These semiconductor switches are implemented as IGBTs (insulated gate bipolar transistors) in the embodiment shown, but could also be implemented as MOSFETs (metal oxide semiconductor field effect transistors), JFETs (junction field effect transistors) or other disconnectable semiconductor components. Optionally, freewheeling elements D1-D6, such as e.g. diodes, are connected in parallel with the semiconductor switches. The freewheeling elements can be omitted if the semiconductor switch itself has a freewheeling function, as is the case, for example, in reverse-conducting IGBTs, MOSFETs or JFETs.

The electrical circuit diagram shown in FIG. 4 illustrates the electrical interconnection of the individual components of the half bridges B1-B3 and illustrates the interconnection of the individual half bridges B1-B3 with one another and with link circuit capacitors C1-C3, one of which is in each case connected in parallel with one half bridge B1-B3. The circuit diagram in FIG. 4 is also representative of the spatial position of the individual half bridges B1-B3 and semiconductor switches Z1-Z6 in the power semiconductor assembly, e.g. the converter in the present case.

Referring to FIG. 4, the individual half bridge branches B1-B3 are arranged next to one another in a first direction L. The semiconductor switches Z1-Z6 are also arranged in this first direction L within the half bridge branches B1-B3, and therefore all the semiconductor switches Z1-Z6 of the converter are arranged next to one another or following one another in this first direction L. The first direction L here corresponds to the main current directions I1, I2, I3 of the individual half bridges B1-B3. In this arrangement, the main current directions of the half bridges B1-B3 are the directions in which the semiconductor switches of the half bridges B1-B3 are arranged between respective half bridge terminals—that is the terminals for the link circuit capacitors C1-C3 in this embodiment.

Figure 1:
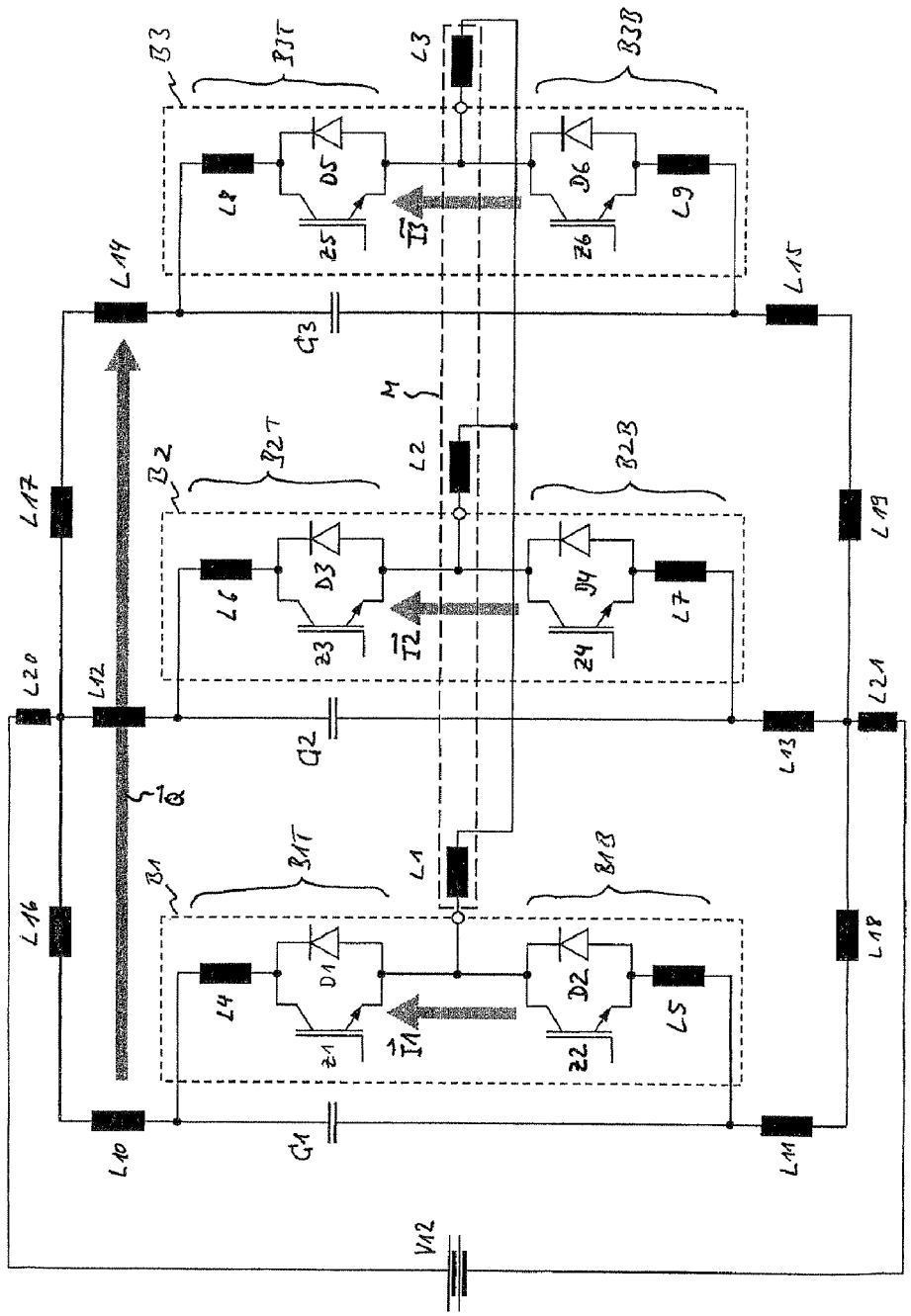
FIG. 1 shows a circuit diagram of a conventional converter having three bridge branches.
Figure 2:
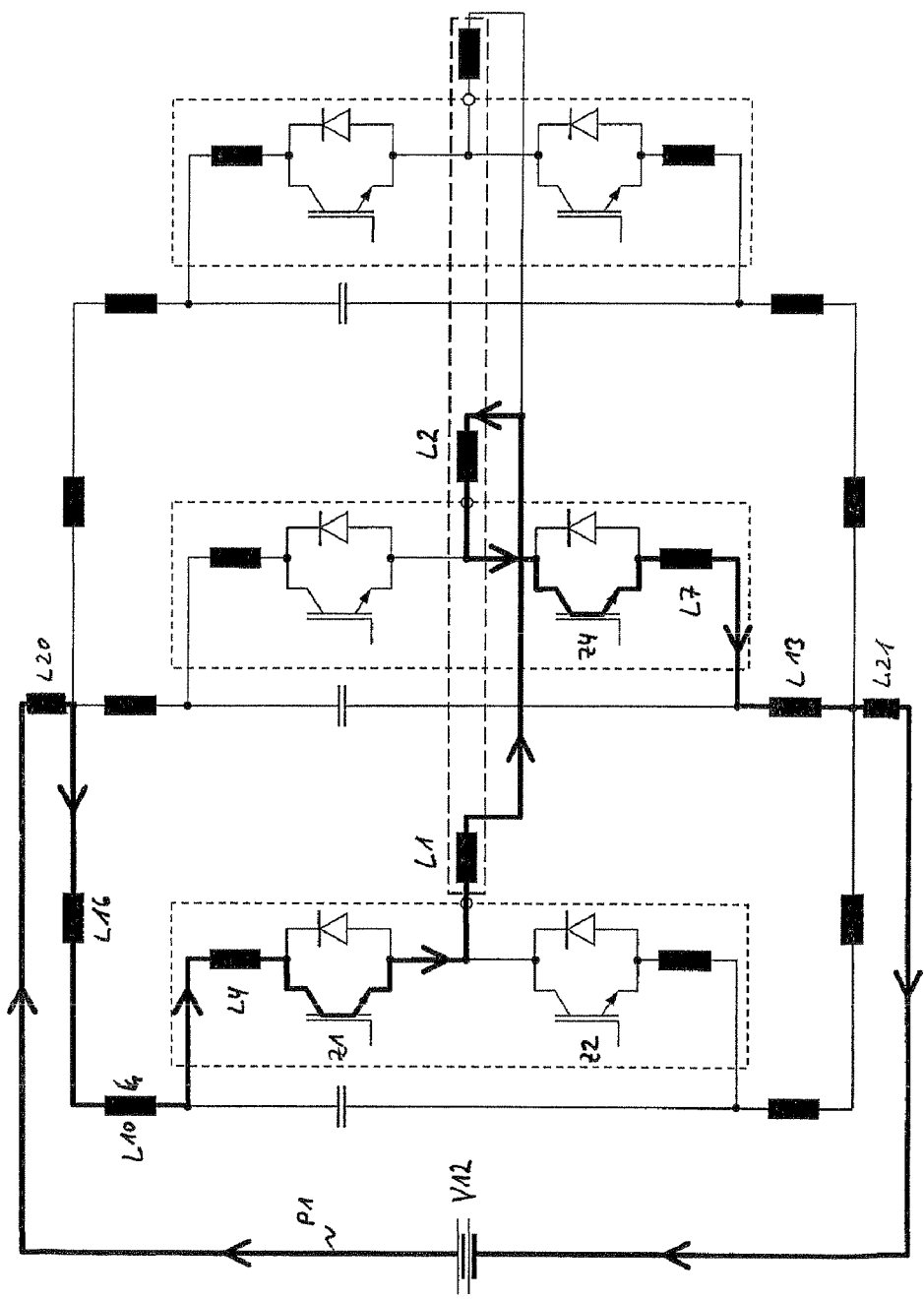
FIG. 2 shows a current flow through the converter of FIG. 1 in a first operating phase.
Figure 3:
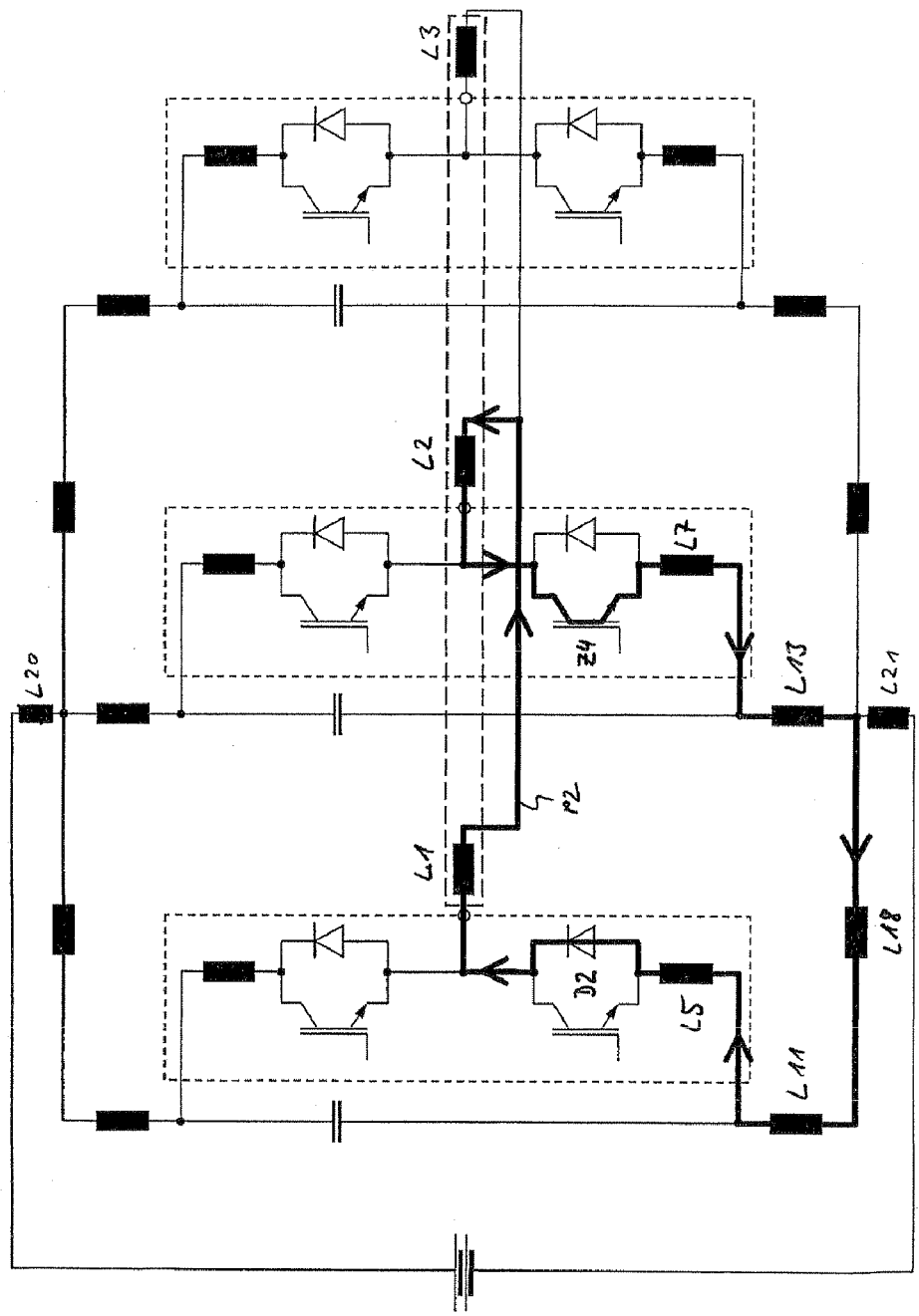
FIG. 3 shows the current flow through the converter of FIG. 1 in a second operating phase present after a commutation process.

In such an arrangement, interfering transverse inductances between the individual half bridge branches can be significantly reduced. The representation of stray inductances according to FIGS. 1 to 3 is omitted in FIG. 4. As a result of this reduction in the transverse inductances L16, L17, L18 and L19, the coupling between the link circuit capacitors C1, C2 and C3 is improved, as a result of which the waviness in the link circuit voltage, occurring during the operation of the converter, is noticeably reduced and transient voltage peaks are attenuated more strongly.

The power switches Z1, Z2, Z3, Z4, Z5, Z6 shown in FIG. 4 are especially implemented as discrete power switches, i.e. each of the power switches is integrated in at least one dedicated semiconductor chip. In this arrangement, the individual power switches can include a number of switching elements connected in parallel and driven jointly and which are in each case integrated in a semiconductor chip.

Figures 5, 6:
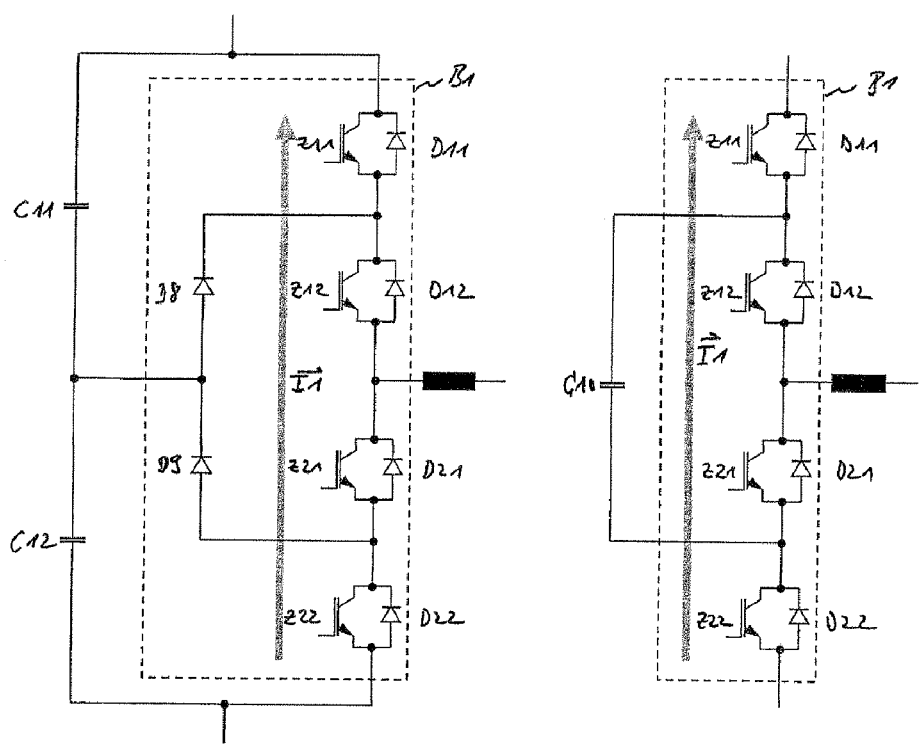
FIG. 5 shows a circuit diagram of a bridge branch for use in a three-level converter according to an embodiment.
FIG. 6 shows a circuit diagram of a bridge branch for use in a three-level converter according to the "flying capacitor" principle, in which converter the semiconductor switches are arranged behind one another.

FIG. 5 shows a circuit diagram of a bridge branch B1, and how the bridge branch B1 can be used, for example, in a three-level converter. The bridge branch B1 includes four semiconductor switches Z11-Z22, the load current paths of which are connected in series and which are arranged next to one another in a first direction 11 corresponding to a main current direction. A capacitive voltage divider with two capacitors C11, C12 is connected in parallel with the bridge branch B1. A tapping point of the capacitor voltage divider C11, C12 is connected to a common node of a first and a second one of the power switches Z11, Z12 via a first diode D8. The tapping point of the capacitor voltage divider C11, C12 is connected to a common node of a third and a fourth one of the power switches Z13, Z14 via a second diode D9. A node common to the second and third power switches Z12, Z13 forms a phase output. A converter (not shown) includes at least two of the bridge branches shown in FIG. 5, which are arranged next to one another in the first direction.

FIG. 6 shows a bridge branch B1, constructed in accordance with the so-called "flying capacitor" principle, for a three-level converter. This bridge branch differs from the one shown in FIG. 5 in that a single capacitor C10 is provided between the common node of the first and second power switches Z11, Z12 and the common node of the third and fourth power switches Z13, Z14. A converter (not shown) includes at least two of the bridge branches shown in FIG. 6, which are arranged next to one another in the first direction.

Figure 7:
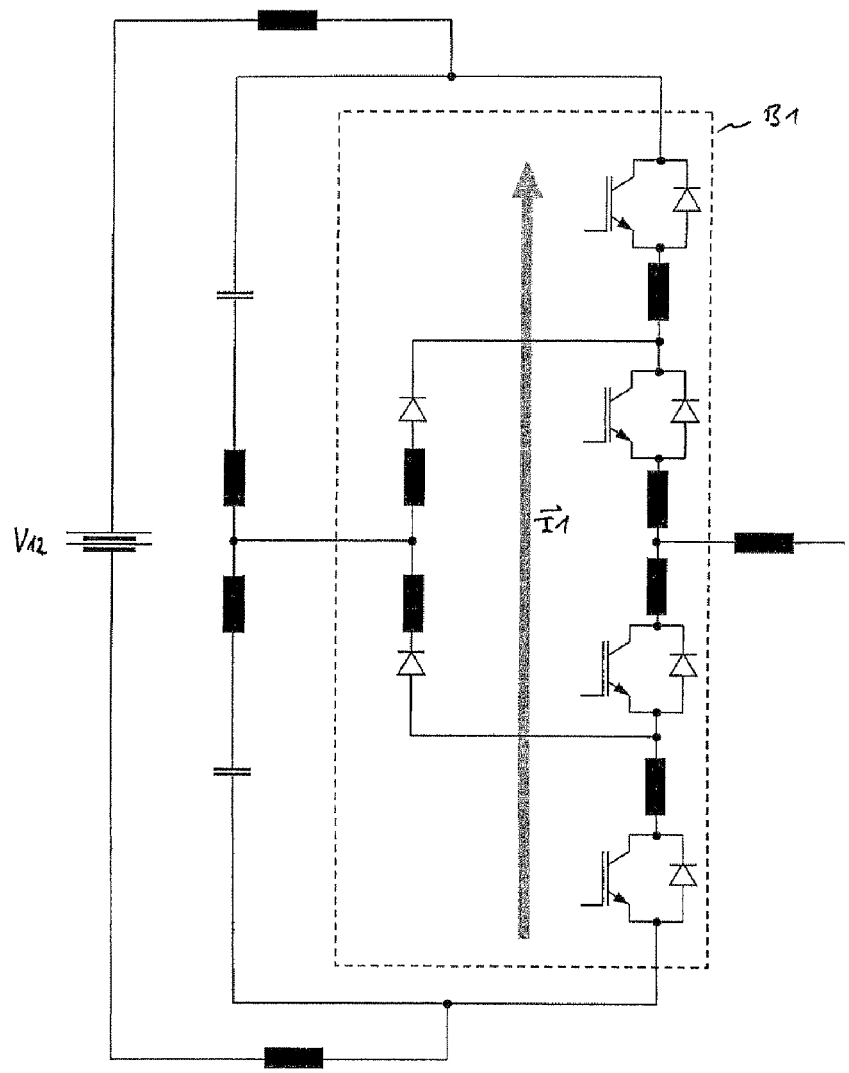
FIG. 7 shows a circuit diagram of the bridge branch of FIG. 5 connected to a link circuit voltage source, whereby stray inductances are additionally shown.

FIG. 7 shows the bridge branch B1 of FIG. 5 connected to a link circuit voltage source V12. Stray inductances are shown in a supplementary manner.

Figure 8:
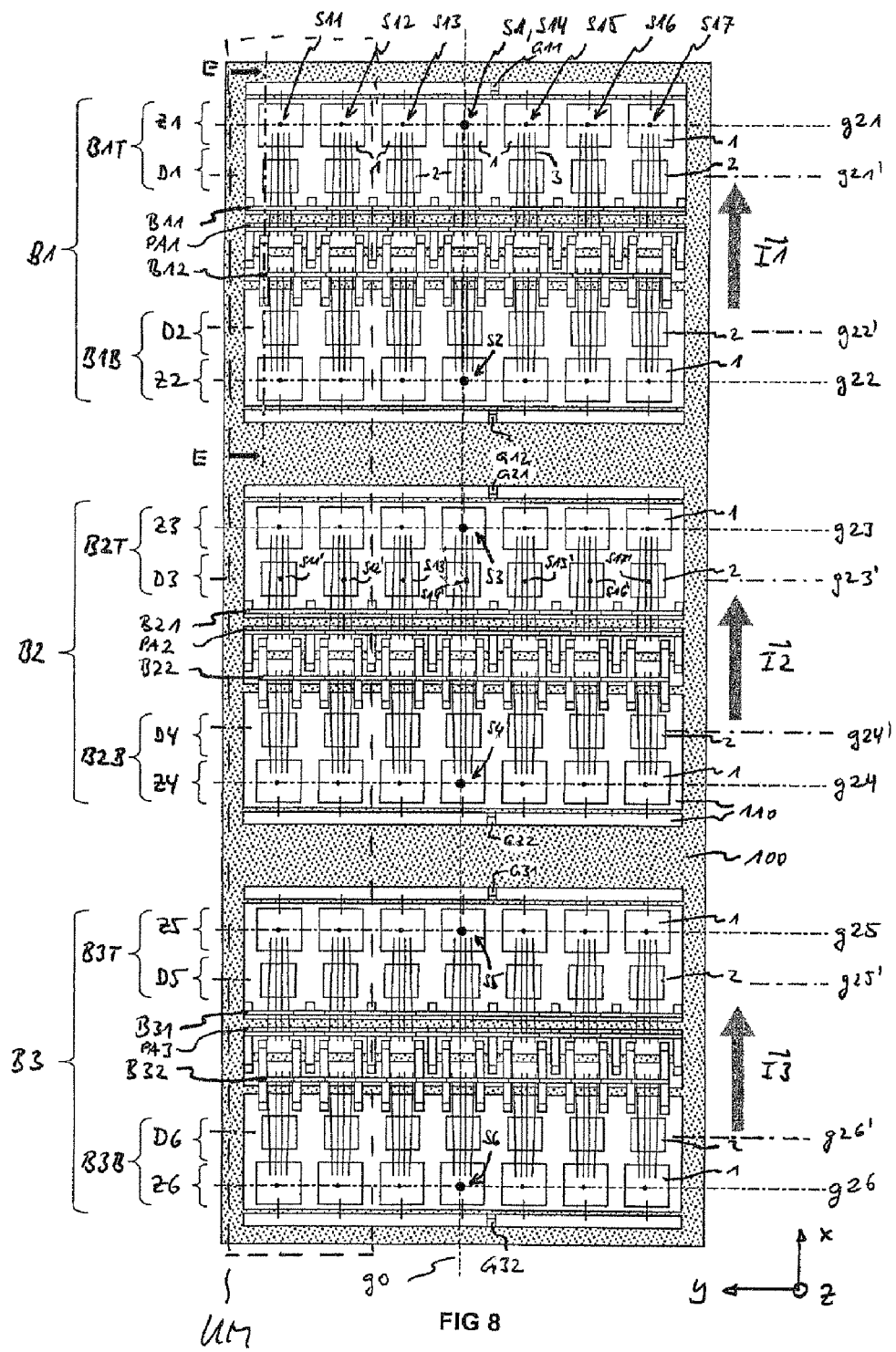
FIG. 8 shows an example for a specific structure of a converter according to FIG. 4.

In the following text, an example for implementing a converter according to FIG. 4 at a module level is explained with reference to FIG. 8. The description made in conjunction with FIG. 8 correspondingly also applies to converters having bridge branches as shown in FIGS. 5 and 6. FIG. 8 shows a plan view of the converter. Optional housing elements and casting compounds are not shown.

The converter includes a circuit carrier 100 provided with conductor tracks and chip assembly areas 110, on which circuit carrier power semiconductor modules and chip modules, respectively, are arranged. Each of the power semiconductor modules include one of the power switches Z1-Z6 and the corresponding optional freewheeling element D1-D6. In this arrangement, two of the power semiconductor modules form one of the bridge branches B1-B3. The power semiconductor modules are arranged next to one another on the circuit carrier 100 in a first direction. In a Cartesian system of coordinates, the axes of which are diagrammatically shown in FIG. 8, the first direction corresponds for example to an x direction.

Each of the power switches Z1, Z2, Z3, Z4, Z5 and Z6 includes a number of parallel-connected switching elements which are in each case integrated in a semiconductor chip 1. The individual semiconductor chips 1 of a power switch are arranged next to one another in a second direction, which extends essentially transverse to the first direction. In the system of coordinates shown, this direction corresponds to a y direction. A z direction of this system of coordinates extends perpendicular to the plane of the drawing shown in FIG. 8.

According to one embodiment, the individual power semiconductor modules are arranged next to one another aligned in the first direction. An offset of two immediately adjacent modules in the second direction can be at a maximum 20% of the width of the module in this second direction if the modules have the same dimensions.

A group of semiconductor chips 1 which are jointly interconnected to form a power switch Z1-Z6 and which, in the embodiment shown, are in each case arranged adjacent to one another in the second direction, have a common center of gravity S1-S6. The center of gravity S1-S6 is defined in such a manner that the sum of the distances of the individual semiconductor chips 1 from the center of gravity is minimal. In a further embodiment, provision is made to arrange the power semiconductor modules in such a manner that the centers of gravity S1, S2, S3, S4, S5 and S6 are located next to one another in the first direction, and in such a manner that none of them has, with respect to a first straight line g1 which extends in the first direction, a distance which is greater than 100% of the center distance of two immediately adjacent semiconductor chips 1.

In the power semiconductor modules of FIG. 8, freewheeling elements D1-D6, such as e.g. diodes, are provided which in each case include a number of semiconductor chips 2 arranged adjacent to the semiconductor chips 1 with the switching elements of the power switches Z1-Z6 in the first direction. In the following description, the semiconductor chips 1 of the power switches Z1-Z6 are also called switch chips and the semiconductor chips 2 of the freewheeling elements are called diode chips.

The diode chips 2 of a power switch could also be arranged adjacent to the switch chips 1 of the power switch in the second direction, for example in such a manner that switch chips 1 and diode chips 2 alternate. The center distance of two immediately adjacent switch chips 1 is greater in this case, since a diode chip is arranged between the two switch chips 1. The maximum distance of the centers of gravity S1-S6 from the straight line g1 can be, for example, less than 15 mm or in particular less than 7 mm.

In principle, the number of switching elements or semiconductor chips 1 forming a power switch Z1, Z2, Z3, Z4, Z5 and Z6 can be selected arbitrarily, i.e. a power switch Z1, Z2, Z3, Z4, Z5 and Z6 can either include exactly one controllable switching element or else a plurality of switching elements connected electrically in parallel, which are jointly driven in that their gate or base terminals are electrically connected to one another. The number of semiconductor chips 2 which form a freewheeling element D1-D6 of a power semiconductor module does not necessarily correspond to the number of semiconductor chips forming a power switch Z1-Z6. The number of diode chips 2, in particular, can be less than the number of switch chips 1.

The electric interconnection of the switch chips 1 and the diode chips 2 is facilitated with the aid of conductor tracks 110, and with the aid of bond wires 3 and metallic terminal plates 4. In principle, however, any other connecting techniques such as, for example, a conductor track pattern 110 can also be selected in conjunction with a flexible circuit board pattern laminated onto the chip tops and the top of the circuit carrier 100. In the embodiment shown, the switching elements integrated into the switch chips 1 are vertical components. A first load current path terminal (drain or collector terminal) of such a switching element is formed by a rear of the respective switch chip 1 and a second load current path terminal is present at a front of the switch chip. Correspondingly, the components integrated into the diode chip 2 are vertical components, one terminal of which is formed by the rear of the diode chip 2 and the other terminal of which is formed by the front of the diode chip 2. In the embodiment shown, the switch chips 1 of a power semiconductor module and the diode chips 2 of a power semiconductor module are mounted on a common conductor track at their rear sides. In the area of the front sides, the switch chips 1 and the diode chips 2 are connected by bond wires to connect the switch chips 1 and the diode chips 2 in parallel.

As shown in FIG. 8, the individual semiconductor chips 1 which form a power switch Z1-Z6 can be arranged aligned in the second direction. A mutual offset of two adjacent semiconductor chips 1 in the first direction can be at a maximum 100% of the width of one semiconductor chip 1 in the first direction.

In a further embodiment, provision is made to arrange the semiconductor chips 1 of a power switch Z1-Z6 on a straight line extending in the second direction, in such a manner that a center or a center of gravity, respectively, S11-S17 of each individual semiconductor chip is located on the line or, at a maximum, at a distance from this line which corresponds to 100% of the chip width. Straight lines on which the individual semiconductor chips are arranged are designated by g21, g22, g23, g24, g25 and g26, respectively, in FIG. 8.

Correspondingly, in each of the freewheeling elements D1, D2, D3, D4, D5 and D6 as well, the centers of gravity of all the diode chips 2 which are connected in parallel to form the relevant freewheeling element D1, D2, D3, D4, D5 or D6, can be arranged along a second straight line g21', g22', g23', g24', g25' and g26', the direction of which extends perpendicularly to the direction of the first straight line g1. Distances of the diode chips 2 from these straight lines can be, for example 100% of a chip width at a maximum.

As is also shown in FIG. 8, each of the bridge branches B1, B2, B3 can have a first terminal lug B11, B21 and B31 and a second terminal lug B12, B22 and B32, respectively, via which the relevant bridge branch B1, B2 and B3, respectively, can be connected to a link circuit voltage (e.g. V12 in FIG. 4). One each of these terminal lugs is allocated to one power semiconductor module. The first terminal lugs B11, B21, B31 in the embodiment shown are connected electrically conductively to the conductor track of the power semiconductor modules B1T, B2T and B3T and thus contact the drain or collector terminals of the power switches Z1, Z3, Z5. The second terminal lugs B12, B22, B32 are electrically conductively connected to the fronts of the semiconductor chips 1 of the power semiconductor modules B1B, B2B and B3B and thus contact the source or emitter terminals of the power switches Z2, Z4, Z6.

Further terminal lugs or terminal bands PA1, PA2, PA3 form the phase outputs of the half bridge branches. These further terminal lugs PA1, PA2, PA3 are arranged, in the embodiment shown, in the first direction between the power semiconductor modules which form one half bridge branch. The conductor tracks 110 of the power semiconductor modules B1B, B2B, B3B, which form the power switches Z2, Z4, Z6, and the fronts of the semiconductor chips 1 of the power semiconductor modules B1T, B2T, B3T are connected to one each of these further terminal lugs PA1, PA2, PA3. In this manner, the source or emitter terminals of the power switches Z1, Z3, Z5 and the drain or collector terminals of the power switches Z2, Z4, Z6 are connected to terminal lugs PA1, PA2, PA3 of the phase outputs. Gate terminals at the fronts of the switch chips 1 are connected to control terminals G11, G12, G21, G22, G31, G33 via bond wires and further conductor tracks 110.

According to an embodiment, the terminal lugs or terminal bands which contact load current path terminals of the switch chips 1 and which are either connected to the link circuit voltage or which form the phase outputs, extend in the second direction at least approximately over the entire width of the power semiconductor modules and are connected to the switch chips 1 and the conductor tracks 110, respectively, along the width of a number of places via bond wires or connecting clips. The width of the power semiconductor modules is predetermined by the dimensions of the conductor tracks 110 in the second direction in the embodiment shown. Transverse currents can be prevented or at least reduced within the individual power semiconductor modules via the multiple connection of the terminal lugs to the conductor tracks 110 and the switch chips. In this context, transverse currents are those currents which flow within the modules in the second direction, i.e. transverse to the first direction— which corresponds to the main current direction. Transverse currents within the terminal lugs are prevented by these terminals lugs being connected to tape-like conductors (not shown), which extend above the arrangement shown in FIG. 8. The width of these tape-like conductors in the second direction can correspond, for example, at least to the dimensions of the terminal lugs in the second direction.

Apart from transverse currents within the individual power semiconductor modules, transverse currents—i.e. currents which flow transverse to the main current direction—between the individual bridge branches B1-B3 are also prevented in the converter according to FIG. 8 by not only arranging the power semiconductor modules of a bridge branch or of a half bridge branch B1-B3 which are arranged behind one another in the first direction, but by arranging all the power semiconductor modules of the converter behind one another in the first direction.

The converter shown in FIG. 8 includes three bridge branches B1, B2, B3 each having one half bridge, whereby each half bridge includes two power semiconductor modules B1T-B3T, B1B-B3B so that overall six power semiconductor modules are arranged next to one another in the first direction.

Instead of the half bridges shown in FIGS. 4 and 8, the converter could also be implemented by using the bridge branches shown in FIGS. 5 and 6, in which arrangement a three-phase converter would have 12 power switches (4 per bridge branch). The power semiconductor modules of these power switches could be arranged—corresponding to the representation in FIG. 8—next to one another in the first direction, i.e. in the main current direction. However, a significant reduction in the transverse currents can already be achieved by arranging the four power switches of a bridge branch, that is, the four power switches which are connected directly or indirectly to a common phase output, next to one other in the first direction. With respect to a maximum offset of the individual power semiconductor modules with respect to one another or a maximum offset of the individual semiconductor chips, the statements made in relation to FIG. 8 apply correspondingly here.

Figure 9:
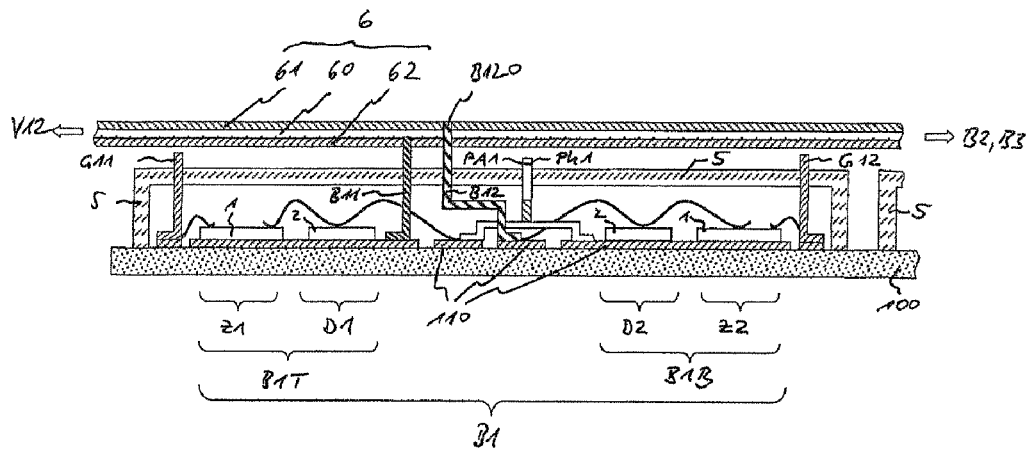
FIG. 9 shows a vertical section through a section of the converter shown in FIG. 8, which section includes the first bridge branch B1.

FIG. 9 shows a vertical cross section through two power semiconductor modules which form one bridge branch, and the associated terminal lugs. A cross section is shown through the power semiconductor modules of the first bridge branch B1 in the sectional plane E-E shown in FIG. 8. In this sectional view, in particular the terminal lugs B11 and B12 of the bridge branch B1 are readily visible.

Figure 10:
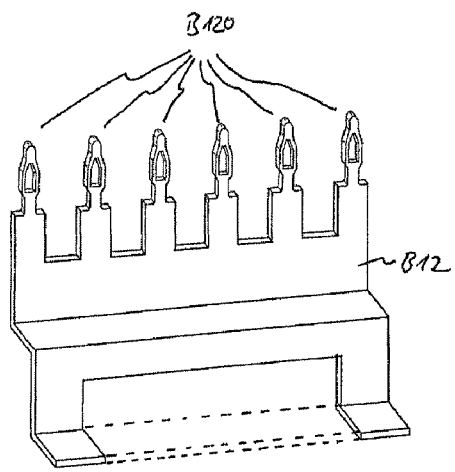
FIG. 10 shows a perspective view of a terminal plate provided with press-in contacts according to an embodiment.

The terminal lugs B11, B21, B31, B12, B22 and B32 shown in FIG. 8 can be constructed as angled plates which are attached to the carrier 100 at one end as shown in FIG. 10, by way of example, via the terminal lug B12. The terminal lug B12 can be attached to the carrier 100 over its entire length (shown dashed) or has, as shown, a number of terminal legs for mounting on the carrier 100. At one opposite end, the terminal lug may have several, for example at least three, connecting points B120 which are used for connecting the terminal lug B12 to a tape-like conductor or strip conductor. These connecting points 120 can be constructed, for example, as press-in contacts which can be pressed into corresponding openings of a strip conductor 6 for forming a press-in connection ("press-fit connection") as shown schematically in FIG. 9. The connecting points are distributed over the entire width of the terminal lug, in order to connect the terminal lug over the entire width to the strip conductor 6 with the lowest possible contact resistance and, as a result, prevent or at least reduce, transverse currents in the terminal lug B12.

Alternatively, the external connecting points 120 can be constructed as screw terminals with a number of screws next to one another for a connection, as solder contacts, press contacts, spring contacts, etc.

In the cross-sectional view according to FIG. 9, there are also shown a housing 5, and a strip conductor 6 ("stripline") with two conductor strips 61 and 62, insulated from one another by a dielectric 60, which conductor strips 61 and 62 serve for connecting the half bridge branches B1, B2 and B3 to a link circuit voltage V12. The conductor strips 61 and 62 are constructed as flat plates or foils and extend at least section by section at the shortest possible distance in parallel with one another and with the circuit carrier 100. Referring to the system of coordinates according to FIG. 8, the conductor strips 61, 62 are arranged in the z direction above the power semiconductor modules. A current flows through these conductor strips 61, 62 in the first direction or x direction, i.e. in the main current direction. From the power semiconductor modules, the current flows via the terminal lugs in the z direction to the conductor strips 61, 62.

In the converter shown in FIG. 8, the power semiconductor modules are arranged on a common carrier 100. Using the principle explained previously of arranging the power switches next to one another in the first direction, the converter can also be constructed modularly by distributing the switching elements which form the power switches Z1-Z6 of the converter over several, at least two, carriers. With reference to the representation according to FIG. 8, such a modular structure is obtained by the carrier being subdivided into a number of carriers in the second direction. In FIG. 8, UM designates a converter module obtained by such subdividing. Thereby, each converter module includes all power switches required for the operation of a converter, each power switch including at least one switch chip. To implement the converter, several, at least two, converter modules UM are connected in parallel by using busbars (not shown). Thereby, the individual converter modules UM are arranged next to one another in a direction perpendicular to the first direction.

FIG. 11 shows a vertical section through a converter mounted on a heat sink 200, in which converter the upper and lower half bridge branches B1T, B1B, B2T, B2B, B3T and B3B are each arranged on separate circuit carriers 100 and in separate housings 5. The electrical interconnection of the half bridge branches B1T, B1B, B2T, B2B, B3T with one another and connection thereof to a link circuit voltage source V12 is realized using a strip conductor 6 which includes conductor strips 61, 62, 63, 64 and 65 electrically insulated from one another by a dielectric 60. The conductor strips 61 and 62 are used for connection to a link circuit voltage source V12 (see e.g. FIG. 4), the conductor strips 63, 64, 65 are used for connecting a load M (see e.g. FIG. 1) to the phase outputs Phi, Ph2 and Ph3 (see e.g. FIG. 4) and for connecting the upper half bridge branches B1T, B2T, B3T to the associated lower half bridge branches B1B, B2B and B3B, respectively, of the same half bridge B1, B2 and B3, respectively. Furthermore, link circuit capacitors C1, C2 and C3 are also provided, as are shown e.g. in FIG. 4.

FIG. 12 shows a vertical section through another converter, also mounted on a heat sink 200. In this arrangement, each of the half bridges B1, B2 and B3 is arranged on a separate circuit carrier 100, each of which has a number of metallization planes 151, 152, 153 between which dielectric layers 161, 162 are arranged for electrically insulating the metallization planes 151, 152, 153. Where necessary, the metallization planes 151, 152, 153 can be patterned to form conductor tracks and/or conductor areas, so that the circuit carriers 100 can take over the operation of a multi-layer circuit board. To produce electrically conductive connections, through-contacts 170 can be provided in the dielectric layers 161, 162 between conductor tracks and/or conductor areas which are arranged in different metallization planes 151, 152, 153. Optionally, the lowest metallization plane 152 of the circuit carrier 100 can be electrically insulated completely with respect to the other metallization planes 151, 152 of the circuit carrier 100. The dielectric layers can consist of e.g. a ceramic material such as aluminum oxide, aluminum nitride, silicon nitride or beryllium oxide. Insulation materials made of plastic can also be used, or even a circuit board as substrate.

The connection to a link circuit voltage source is carried out by conductor strips 61, 62 of a strip conductor 6 in the same manner as in the arrangement according to FIG. 11. In contrast to the arrangement shown in FIG. 11, however, the connection between each upper bridge branch is carried out with the aid of the metallization planes 151, 152, 153 of the circuit carrier 100 on which the relevant bridge branch B1, B2, B3 is arranged, within each of the bridge branches B1, B2 and B3. In this arrangement, there are also link circuit capacitors C which are electrically connected to the conductor strips 61 and 62. Optional drive circuits 300 for driving the controllable power switches are also arranged on the strip conductor 6.

Figures 13A, 13B:
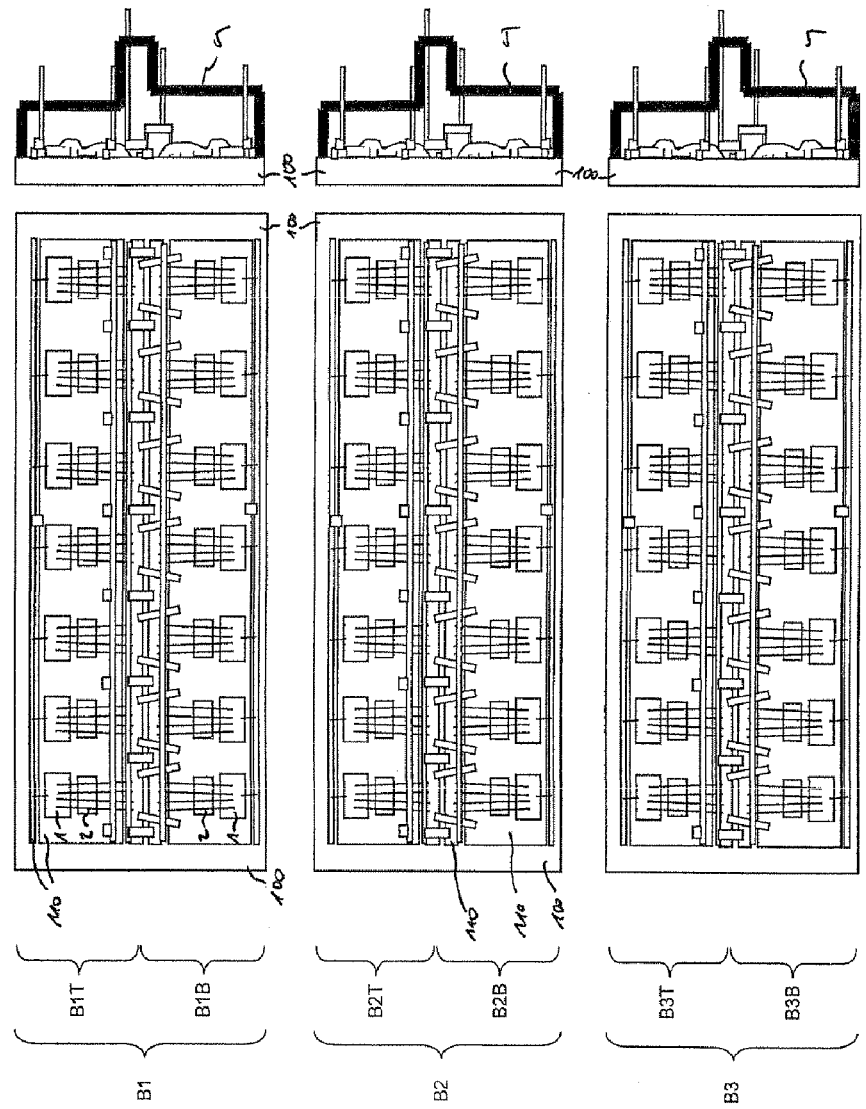
FIG. 13A shows a plan view of a three-phase converter in which each bridge branch is constructed as single power semiconductor module according to an embodiment.
FIG. 13B shows a sectional view of the three-phase converter of FIG. 13A.

FIGS. 13A and 13B show plan and cross section views of a three-phase converter, respectively. The converter includes for each bridge branch B1, B2, B3 a dedicated module arrangement, each of which has a separate metallic bottom plate 100 on which the respective bridge branch B1, B2, B3 is arranged. Each module also has a dedicated housing 5, which, however, is shown only in FIG. 13B.

In the three-phase converter according to FIGS. 14A (plan view) and 14B (cross section), all bridge branches B1, B2 and B3 are arranged on a common circuit carrier 100 which, in principle, can have a structure similar to the circuit carrier 100 previously described herein with reference to FIG. 12. Again, the bridge branches B1, B2, B3 can be interconnected with one another with the aid of the circuit carrier 100.

In the arrangements shown in FIGS. 13A, 13B and 14A, 14B, the connection to a link circuit voltage source can also be carried out by a strip conductor, as previously described herein with reference to FIGS. 9 to 11.

FIGS. 15A (plan view) and 15B (cross section) show a further embodiment of a a converter. The arrangement of the bridge branches B1, B2 and B3 on a common circuit carrier 100 follows the principle explained previously herein with reference to FIGS. 14A and 14B. However, a foil technology is used instead of bond wires 3 in order to implement the required electrical connections on the top of the circuit carrier 100 and of the semiconductor chips 1 located on the latter (including the diode chips 2 shown covered). For this purpose, dielectric layers 80 and conductor layers 90 are laminated onto the top in an arbitrary number of layers, in principle. This can be carried out, for example, by using known photo—and/or mask technology. When photo-technology is used, e.g. a dielectric layer 80 or a conductor layer 90 can first be first applied completely to the top and then photo- technically patterned such that a subsequently applied conductor layer or dielectric layer inserts itself into the patterns of the underlying layer(s). In the case of mask technology, in contrast, the dielectric layers 80 or conductor layers 90, respectively, are not applied as complete layers but instead only in the open areas of the mask. By applying these techniques several times, also in combination with one another, a virtual circuit "board" can be produced which, however, is generally not level but follows the profile, in particular, of the semiconductor chips 1, 2. In the plan view according to FIG. 15A, segments of the dielectric layer 80 and of the conductor layer 90 are indicated as dashed in order to illustrate the principle of the foil technology described above.

In the converter shown in FIGS. 16A (plan view) and 16B (cross section), a circuit carrier 100 common to all the bridge branches B1, B2 and B3 is used, which circuit carrier 100 includes two conductor layers 151 and 152 insulated from one another by a ceramic dielectric layer 161, of which the upper conductor layer 151 is patterned into conductor tracks and conductor areas. The bridge branches B1, B2 and B3 on the top of the arrangement are interconnected by foil technology, e.g. as previously described herein with reference to FIGS. 15A and 15B. Here, however, two patterned conductor layers 90 and 91 are provided, the topmost conductor layer 91 of which is removed in FIG. 16A merely to show the underlying areas.

The joining and connecting techniques described above, e.g. bond wires 3, conductor track connections 110, through-contacts 170, multi-layer circuit carriers 100, strip conductors 6 and foil technology can be used in any combinations with one another. In principle, any types of converters or other electrical units can be implemented in accordance with the principles of the embodiments explained.

Figure 17A:
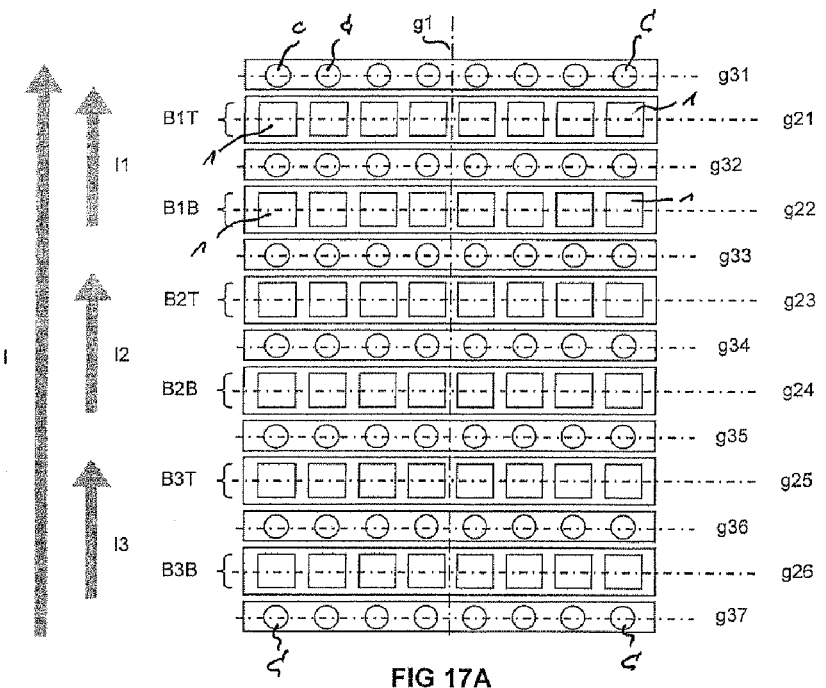
FIG. 17A shows a schematic representation of a converter according to an embodiment in which the controllable semiconductor chips of each of the upper and lower bridge branches and the link circuit capacitors are arranged in parallel rows.

FIG. 17A shows a basic construction of a converter in which the controllable semiconductor chips 1 of one of each of the upper and lower bridge branches B1T, B2T, B3T and B1B, B2B, B3B, respectively, are in each case arranged in rows. FIG. 17A also shows the associated second straight lines g21, g22, g23, g24, g25, g26, the directions of which in each case extend perpendicular to the main current direction I1, I2 and I3, respectively, of the associated bridge branch. As shown in FIG. 17A, the main current directions I1, I2 and I3, respectively, are preferably identical, and therefore a common main current direction I of the converter can be defined.

Figure 17B:
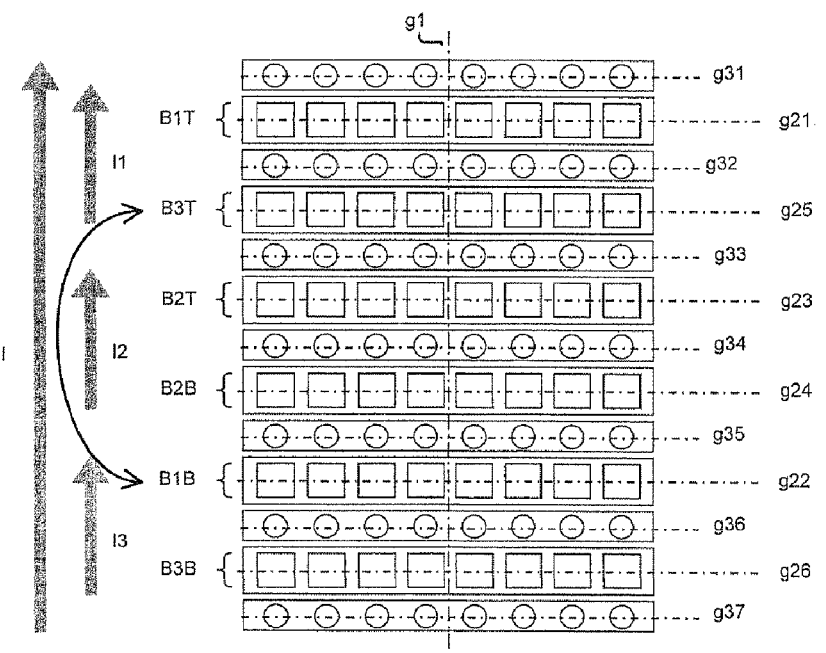
FIG. 17B shows a schematic according to FIG. 17A in which the rows of the upper bridge branch and the lower bridge branch are interchanged.

The order of the bridge branches B1T, B2T, B3T, B1 B, B2B, B3B can be selected arbitrarily according to some embodiments of the invention. Thus, e.g., in the configuration according to FIG. 17B which, for the rest, corresponds to the configuration of FIG. 17A, the bridge branches B1 B and B3T are exchanged, whereby, of course, the interconnection of the converter is to be adapted correspondingly. FIGS. 17A and 17B also show that link circuit capacitors C can also be arranged in rows along third straight lines g31, g32, g33, g34, g35, g36, g37, which extend in parallel with the second straight lines g21, g22, g23, g24, g25, g26, g27.

Figure 18:
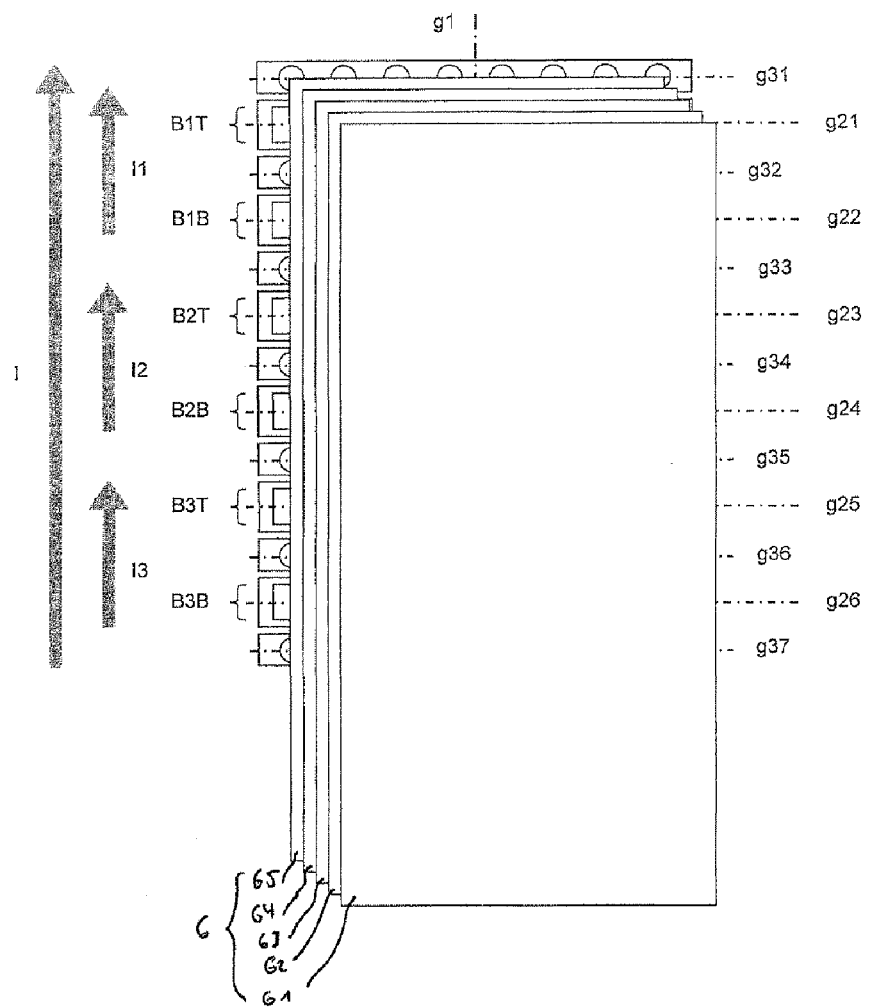
FIG. 18 shows a plan view of the arrangement according to FIG. 17A in which a conductor strip having several conductor strips for interconnecting the bridge branches is used.

FIG. 18 schematically shows a plan view of the converter according to FIG. 17A with a number of conductor strips 61, 62, 63, 64, 65, routed in parallel at least section by section, of a strip conductor 6.

In the exemplary embodiments explained up to this point, the power semiconductor modules including in each case one power switch Z1-Z6 are arranged in one plane, i.e. circuit carriers 100 and 200, respectively, are constructed as planar carriers. If, for example, a Cartesian system of coordinates is allocated to the circuit carrier 100 as shown in FIG. 8, in which system of coordinates an x direction corresponds to the previously explained first direction, a y direction corresponds to the previously explained second direction and a z direction corresponds to the direction perpendicular to the plane of the drawing, the power semiconductor modules and the semiconductor chips, respectively, are located in a common plane. The tape or strip conductors e.g. as shown in FIG. 9, are also constructed as planar conductors in this case.

Figure 19:
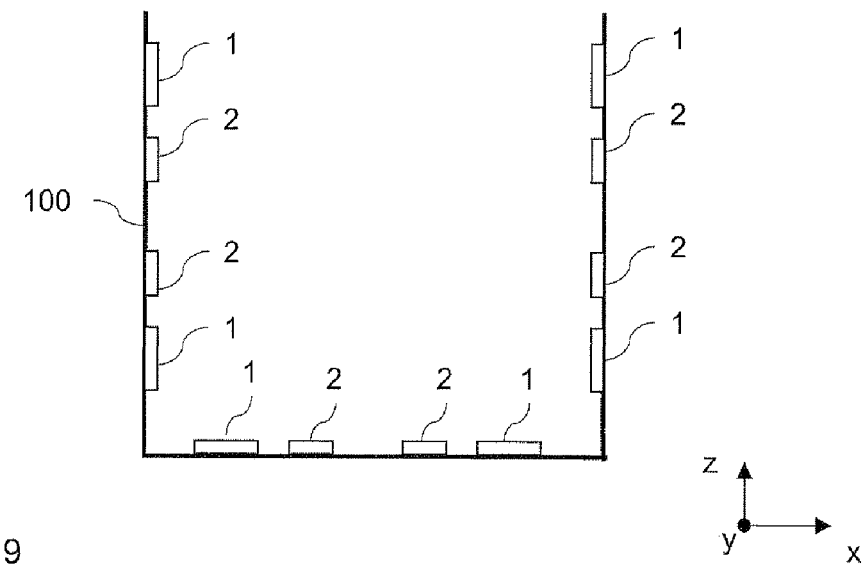
FIG. 19 schematically shows a converter with power semiconductor modules which are arranged on a U-shaped carrier according to an embodiment.

In a further exemplary embodiment, which is shown schematically in FIG. 19, the circuit carrier 100 is U-shaped, with a bottom located in the x-y plane, and two side walls each located in an x-z plane. In this arrangement, the power semiconductor modules of one bridge branch each are arranged at a bottom and at side walls of the U-shaped circuit carrier 100. The switch chips 1 of the power switches Z1-Z6 within the modules are arranged adjacently to one another in the y direction. The switch chips are thus arranged within the modules in a direction extending perpendicular to a spatial curve on which the power semiconductor modules are arranged adjacent to one another. This spatial curve, located in one plane in the embodiment shown in FIG. 8, is formed by the straight line g0, and extends angled away in the embodiment shown in FIG. 19—corresponding to the U-shaped carrier. This spatial curve extends in an x-z plane. As previously described herein, a mutual offset of the power semiconductor modules in the y direction can be at a maximum 20% of the dimensions of the power semiconductor modules in this y direction.

The previously described concept for the implementation and mutual arrangement of bridge branches is not restricted to the previously described converters, but is also applicable to bridge branches in other power semiconductor arrangements such as, e.g., bridge branches in matrix converters.

Figure 20:
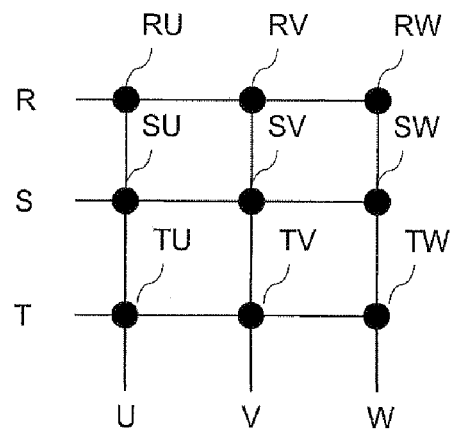
FIG. 20 diagrammatically shows a matrix converter according to an embodiment.

FIG. 20 schematically shows such a matrix converter. The matrix converter has three inputs R, S, T to which input potentials can be applied in each case, and has three outputs U, V, W for providing output potentials. An active circuit node is between each of the inputs and each of the outputs. Each of these circuit nodes is capable of optionally establishing a unidirectional connection from the input to the output or a unidirectional connection from the output to the input or decoupling the input and the output, as determined by control signals (not shown). In each case, the circuit nodes which are connected to an output such as, e.g., the circuit nodes RU, SU, TU connected to the output U, form one bridge branch.

Figure 21:
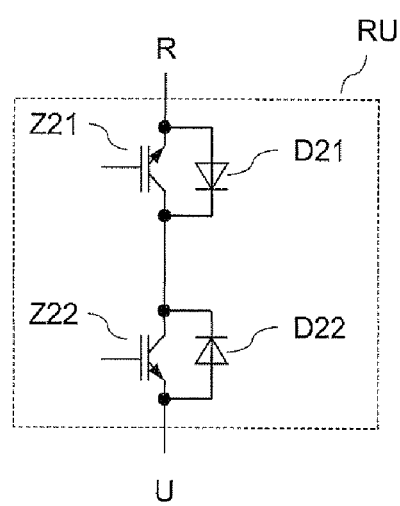
FIG. 21 shows an exemplary implementation of an active circuit node of a matrix converter according to an embodiment.

FIG. 21 illustrates, by means of the active circuit node RU which is located between the first input R and the first output U, a first implementation embodiment of an active circuit node such as this. The other active circuit nodes can be implemented correspondingly. The circuit node comprises two power switches Z21, Z22 implemented as IGBTs, and one element, connected in parallel with each power switch Z21, Z22, for the reverse current direction D21, D22. The power switches Z21, Z22 are connected anti-serially in series, i.e. in such a manner that identical load current path terminals, the drain and collector terminals, respectively, in the embodiment shown, are connected to one another. However, the power switches Z21, Z22 can also be interconnected in such a manner that their emitter and source terminals, respectively, are connected to one another. Correspondingly, the reverse conducting elements D21, D22 are connected anti-serially in series. If during operation of the matrix converter one of the power switches of an active circuit node RU is driven conductively at one time, a current flows via the power switch driven conductively and the reverse conducting element of the other power switch in this case.

Figure 22:
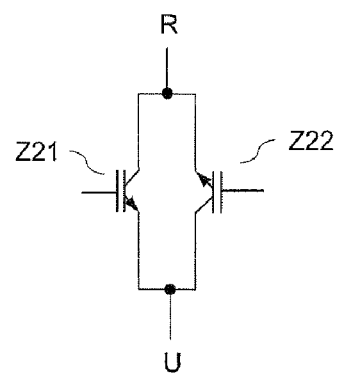
FIG. 22 shows a second exemplary implementation of an active circuit node of a matrix converter according to an embodiment.

Referring to FIG. 22, two circuit breakers Z21, Z22 such as, e.g., reverse-blocking IGBTs which are connected in antiparallel mode, i.e. in such a manner that in each case the drain and collector terminal, respectively, of one circuit breaker is connected to the source and emitter terminal, respectively, of the other circuit breaker, can be provided as an alternative. Such an arrangement is possible when the circuit breakers are in each case capable of blocking voltages with different signs, i.e. voltages in both directions.

The power switches Z21, Z22 of an active circuit node can be arranged in a power semiconductor module. Each of the power switches Z21, Z22 includes a plurality of switching elements, which are in each case integrated in a switch chip. In this arrangement, the switch chips of a power switch are arranged adjacent to one another in the second direction—in accordance with the switch chips 1 as shown in FIG. 8—while the power semiconductor modules of one bridge branch are arranged adjacent to one another in the first direction or are located on a spatial curve extending perpendicular to the second direction. The switching elements of the two power switches Z21, Z22 of an active circuit node can be arranged adjacent to one another in the first direction within the power semiconductor module, for example like the switch chips 1 of the power switches B1T, B1B shown in FIG. 8. The switching elements of the two power switches Z21, Z22 of an active circuit node can also be arranged adjacent to one another in the second direction or alternately next to one another in the second direction. With respect to the arrangement of the power semiconductor modules and the switch chips, respectively, on the spatial curve extending perpendicular to the second direction, the statements made previously apply correspondingly.

In a further exemplary embodiment, provision is also made to arrange the power semiconductor modules of the individual bridge branches of the matrix converter—corresponding to the power semiconductor modules of the half bridge branches shown in FIG. 8—in the first direction and on a spatial curve extending perpendicular to the second direction, respectively, such that, in this case, nine power semiconductor modules are arranged next to one another in the first direction.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor assembly, comprising:
    a circuit carrier;
    a plurality of half-bridges each of which comprises a plurality of power switches, the power switches of each half-bridge being integrated in discrete semiconductor chips and connected in series directly or indirectly to a phase output of that half-bridge, the semiconductor chips of each half-bridge being arranged next to one another on the circuit carrier in a first direction, the half-bridges being arranged next to one another on the circuit carrier in a second direction perpendicular to the first direction; and
    a plurality of flat conductor strips disposed above the half-bridges and electrically insulated from one another by a dielectric, the plurality of conductor strips electrically connecting the at least two half-bridges to each other;
    wherein a main current direction of each half-bridge extends parallel to the second direction,
    wherein a main current direction of the flat conductor strips extends parallel to the second direction.

2. The power semiconductor assembly of claim 1, wherein each of the half bridges includes an upper bridge branch module and a lower bridge branch module arranged next to one another in the second direction, wherein each of the modules of one of the half bridges includes a subset of the semiconductor chips for that half bridge, and wherein a mutual offset of two adjacent ones of the modules in the second direction is less than 20% of the dimensions of an individual one of the modules in the second direction.

3. The power semiconductor assembly of claim 1, wherein each of the half bridges includes an upper bridge branch module and a lower bridge branch module arranged next to one another in the second direction, wherein each of the modules of one of the half bridges includes a subset of the semiconductor chips for that half bridge, and wherein a mutual offset of two adjacent ones of the semiconductor chips in the second direction is less than a dimension of an individual one of the modules in the second direction.

4. The power semiconductor assembly of claim 1, wherein the first direction is predetermined by a straight line.

5. The power semiconductor assembly of claim 1, wherein the first direction is predetermined by a spatial curve located in a plane extending perpendicular to the second direction.

6. The power semiconductor assembly of claim 1, wherein each of the half bridges includes an upper bridge branch module and a lower bridge branch module arranged next to one another in the second direction, wherein each of the modules of one of the half bridges includes a subset of the semiconductor chips for that half bridge, and wherein each of the modules has a flat carrier on which the semiconductor chips for that module are arranged.

7. The power semiconductor assembly of claim 1, wherein the plurality of conductor strips electrically connect the half-bridges in parallel.

8. The power semiconductor assembly of claim 1, wherein there are three half-bridges and three phase outputs, and wherein the plurality of conductor strips electrically connect the three half-bridges in parallel.

* * * * *